(12) United States Patent
Zhan et al.

(10) Patent No.: US 11,375,614 B2
(45) Date of Patent: Jun. 28, 2022

(54) WIRING STRUCTURE, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhifeng Zhan, Beijing (CN); Peng Huang, Beijing (CN); Yanxin Wang, Beijing (CN); Shuquan Yang, Beijing (CN); Wei Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 568 days.

(21) Appl. No.: 16/327,645

(22) PCT Filed: May 25, 2018

(86) PCT No.: PCT/CN2018/088378
§ 371 (c)(1),
(2) Date: Feb. 22, 2019

(87) PCT Pub. No.: WO2019/041908
PCT Pub. Date: Mar. 7, 2019

(65) Prior Publication Data
US 2021/0337661 A1    Oct. 28, 2021

(30) Foreign Application Priority Data
Aug. 31, 2017   (CN) .......................... 201710772275.0

(51) Int. Cl.
*H05K 1/02* (2006.01)
*H05K 1/16* (2006.01)
(Continued)

(52) U.S. Cl.
CPC ......... *H05K 1/0296* (2013.01); *G06F 1/1652* (2013.01); *G06F 1/189* (2013.01);
(Continued)

(58) Field of Classification Search
CPC .... H05K 1/189; H05K 1/0231; H05K 1/0281; H05K 1/0283; H05K 3/222;
(Continued)

(56) References Cited

U.S. PATENT DOCUMENTS 5,777,277 A * 7/1998 Inagawa .............. H05K 1/0233
  174/265
9,600,112 B2 * 3/2017 Zhang ...................... G06F 1/169
(Continued)

FOREIGN PATENT DOCUMENTS

CN    205140985 U    4/2016
CN    205406511 U    7/2016
(Continued)

OTHER PUBLICATIONS

International Search Report dated Aug. 29, 2018 issued in corresponding International Application No. PCT/CN2018/088378.
(Continued)

*Primary Examiner* — Xiaoliang Chen
(74) *Attorney, Agent, or Firm* — Nath, Goldberg & Meyer; Joshua B. Goldberg

(57) ABSTRACT

The present disclosure provides a wiring structure, a display substrate and a display device, and belongs to the field of display technology. The wiring structure of the present disclosure comprises a body portion provided with hollow patterns; the body portion has a first side and a second side
(Continued)

which are provided opposite to each other along an extending direction of the wiring structure, and both the first and second sides are wavy; the body portion comprises a plurality of conductive elements sequentially connected along the extending direction of the wiring structure; and in each conductive element, a length of a protruding portion on the first side in the extending direction of the wiring structure is different from that of a protruding portion on the second side in the extending direction of the wiring structure.

18 Claims, 4 Drawing Sheets

(51) Int. Cl.
    *H05K 3/46*     (2006.01)
    *G06F 1/16*     (2006.01)
    *G06F 1/18*     (2006.01)
    *G09F 9/30*     (2006.01)
    *H01B 7/04*     (2006.01)
    *H05K 1/03*     (2006.01)

(52) U.S. Cl.
    CPC .............. *G09F 9/301* (2013.01); *H01B 7/04* (2013.01); *H05K 1/0346* (2013.01); *H05K 2201/0154* (2013.01)

(58) Field of Classification Search
    CPC ....... H05K 2201/042; H05K 2201/043; H05K 2201/0106; H05K 2201/0195; H05K 2201/0979; H05K 2201/2009; H05K 2201/09263; H05K 2201/09336; H05K 2201/09618; H05K 2201/09663; H05K 2201/09672; H05K 2201/09681; H05K 2201/09781; H05K 2201/10106; H05K 2201/10287; H05K 1/02; H05K 1/16; H05K 1/147; H05K 1/165; H05K 3/46
    USPC ................ 174/268, 251, 254, 265; 345/173; 349/12; 439/108
    See application file for complete search history.

(56) References Cited

U.S. PATENT DOCUMENTS

| | | | | |
|---|---|---|---|---|
| 10,115,337 B2* | 10/2018 | Kim | ...................... | G09G 3/3225 |
| 10,649,565 B2* | 5/2020 | Lee | ...................... | G06F 3/0443 |
| 10,768,732 B2* | 9/2020 | Lee | ...................... | G06F 3/041 |
| 10,824,284 B2* | 11/2020 | Kim | ...................... | G06F 3/0446 |
| 2004/0242035 A1* | 12/2004 | Murayama | .......... | H01R 13/6585 439/108 |
| 2010/0183847 A1* | 7/2010 | Pearce | ...................... | B32B 3/28 428/158 |
| 2010/0252307 A1* | 10/2010 | Mo | ...................... | H05K 1/0281 174/254 |
| 2014/0217373 A1* | 8/2014 | Youn | .................... | H05K 1/0281 257/40 |
| 2014/0232956 A1* | 8/2014 | Kwon | ................. | H01L 27/3276 349/12 |
| 2015/0382446 A1* | 12/2015 | Kwon | ................. | H01L 27/3276 174/251 |
| 2016/0103534 A1* | 4/2016 | Zhang | ................... | G06F 3/0412 345/173 |
| 2016/0109998 A1* | 4/2016 | Watanabe | ........... | G02F 1/13338 349/12 |
| 2016/0219696 A1 | 7/2016 | Choi et al. | | |
| 2017/0302772 A1 | 10/2017 | Zhang et al. | | |
| 2019/0088685 A1* | 3/2019 | Huang | ................ | H01L 27/3276 |

FOREIGN PATENT DOCUMENTS

| | | |
|---|---|---|
| CN | 106205394 A | 12/2016 |
| CN | 106486500 A | 3/2017 |
| CN | 106796999 A | 5/2017 |
| CN | 106898264 A | 6/2017 |
| CN | 106952937 A | 7/2017 |
| CN | 106971671 A | 7/2017 |
| CN | 107039396 A | 8/2017 |
| CN | 107039397 A | 8/2017 |
| CN | 107079579 A | 8/2017 |
| CN | 107393421 A | 11/2017 |
| CN | 107634086 A | 1/2018 |
| JP | 2002131773 A | 5/2002 |
| WO | 2016057231 A1 | 4/2016 |

OTHER PUBLICATIONS

Extended European Search Report dated Apr. 28, 2021 corresponding to application No. 18851333.7-1230.
Indian First Office Action dated May 5, 2021 corresponding to application No. 201927034163.
First Office Action dated Jan. 4, 2022 for application No. JP2019-547967 with English translation attached.

* cited by examiner

WIRING STRUCTURE, DISPLAY SUBSTRATE AND DISPLAY DEVICE

CROSS-REFERENCE TO RELATED APPLICATION

This is a National Phase Application filed under 35 U.S.C. 371 as a national stage of PCT/CN2018/088378, filed May 25, 2018, an application claiming the benefit of Chinese Application No. 201710772275 filed 31 Aug. 2017, the disclosure of which is incorporated herein by reference.

TECHNICAL FIELD

The present disclosure relates to the field of display technology, and particularly relates to a wiring structure, a display substrate and a display device.

BACKGROUND

For manufacturing flexible display devices, various display components have been developed for using organic materials, such as organic light-emitting layers, organic passivation layers and polymer substrates (such as polyimide substrates) serving as flexible substrates. However, it is hard to replace a metal trace in a display with an organic material, because conductivity of the organic material is much lower than that of the metal trace. When a flexible display device is bent, the metal trace in a display panel may be broken (with about 1% of the trace broken due to strain), which will cause failure of the display device.

SUMMARY

The present disclosure aims at solving at least one of the technical problems found in related art, and provides a wiring structure which is not easily broken, a display substrate and a display device having the same.

A technical solution directed to the technical problem of the present disclosure provides a wiring structure, including a body portion provided with hollow patterns; the body portion has a first side and a second side which are provided opposite to each other along an extending direction of the wiring structure, and both the first and second sides are wavy; wherein, the body portion includes a plurality of conductive elements sequentially connected along the extending direction of the wiring structure; and in each conductive element, a length of a protruding portion on the first side in the extending direction of the wiring structure is different from that of a protruding portion on the second side in the extending direction of the wiring structure.

According to embodiments of the present disclosure, in each conductive element, a curvature degree of the protruding portion on the first side is different from that of the protruding portion on the second side.

According to embodiments of the present disclosure, every two adjacent protruding portions on the first side have different curvature degrees; and/or every two adjacent protruding portions on the second side have different curvature degrees.

According to embodiments of the present disclosure, each conductive element includes one protruding portion on the first side and one protruding portion on the second side.

According to embodiments of the present disclosure, a connection line connecting a connection point on the first side and a connection point on the second side of two adjacent conductive elements extends along a direction which intersects with a direction perpendicular to the extending direction of the wiring structure.

According to embodiments of the present disclosure, every two adjacent conductive elements are centrally symmetrical to each other in structure.

According to embodiments of the present disclosure, each of the first and second sides is provided with at least three protruding portions having different curvature degrees.

According to embodiments of the present disclosure, from at least one pair of two adjacent conductive elements of the body portion, one of the two adjacent conductive elements includes one protruding portion on the first side and two protruding portions on the second side, and the other one of the two adjacent conductive elements includes two protruding portions on the first side and one protruding portion on the second side.

According to embodiments of the present disclosure, the conductive element including one protruding portion on the first side and two protruding portions on the second side and a conductive element adjacent to the conductive element and including two protruding portions on the first side and one protruding portion on the second side are centrally symmetrical to each other in structure.

According to embodiments of the present disclosure, the wiring structure includes a plurality of body portions; a first side of one of every two adjacent body portions and a second side of the other of the two adjacent body portions are joined together to form an integral structure.

According to embodiments of the present disclosure, the hollow patterns in the two adjacent body portions are arranged in a stagger way.

According to embodiments of the present disclosure, each of the plurality of conductive element is provided with one hollow pattern.

According to embodiments of the present disclosure, the hollow pattern has a shape of any one of circles, ellipses, rectangles and rhombuses.

According to embodiments of the present disclosure, the conductive elements are formed to be an integral structure.

The present disclosure further provides a display substrate, including a base and the aforesaid wiring structure provided thereon.

The present disclosure further provides a display device, including the aforesaid display substrate.

DETAILED DESCRIPTION

Figure 1:
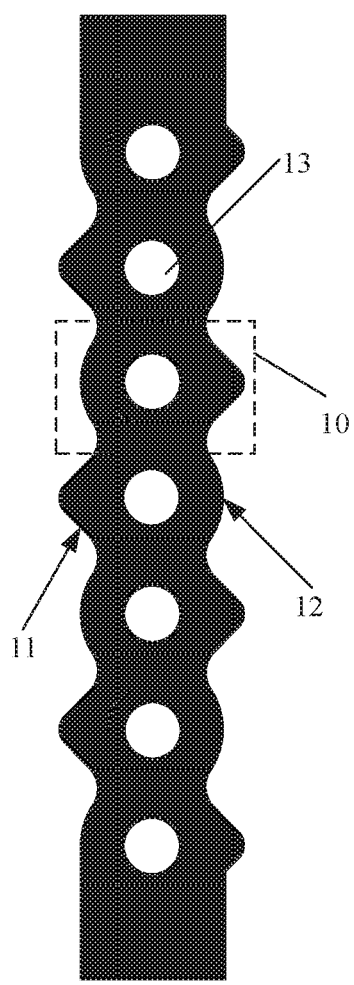
FIGS. 1-3 are schematic diagrams of wiring structures according to embodiments of the present disclosure.

In order to enable those skilled in the art to better understand the technical solutions of the present disclosure, the present disclosure will be further described in detail below with reference to the accompanying drawings and specific implementations.

As shown in FIGS. 1-5, embodiments of the present disclosure provides a wiring structure, including a body portion provided with hollow patterns 13. The body portion has a first side 11 and a second side 12 which are provided opposite to each other along an extending direction of the wiring structure, and both the first side 11 and the second side 12 are wavy. The body portion includes a plurality of conductive elements 10 sequentially connected along the extending direction of the wiring structure. In each conductive element 10, a length of a protruding portion on the first side in the extending direction of the wiring structure is different from that of a protruding portion on the second side in the extending direction of the wiring structure. Therefore, when the wiring structure is bent, a connection line connecting strain concentration points will not be parallel to a bending line (a straight line where a crease is positioned when the wiring structure is bent), so as to prevent a crack formed by the bending from extending along a direction of the connection line connecting strain concentration points, thereby avoiding fracture of the wiring structure.

According to the embodiments of the present disclosure, in each conductive element 10, a curvature degree of the protruding portion on the first side 11 is different from that of the protruding portion on the second side 12.

In the embodiment, both the first side 11 and the second side 12 of the body portion of the wiring structure are wavy (i.e., each side is composed of a plurality of connected protruding portions), and a curvature degree of the protruding portion on the first side 11 is different from that of the protruding portion on the second side 12 in each conductive element 10 of the body portion, so that a bending force capable of being withstood by the protruding portion on the first side 11 is different from that capable of being withstood by the protruding portion on the second side 12 in each conductive element 10. Therefore, even if the protruding portion on one side of the conductive element 10 breaks, connection of the wiring structure may still be maintained by the protruding portion on the other side, so as to avoid failure of the wiring structure due to fracture caused by bend.

Any two adjacent protruding portions on the first side 11 of the body portion have different curvature degrees; and/or any two adjacent protruding portions on the second side 12 have different curvature degrees. That is, any two adjacent protruding portions on at least one of the first side 11 and the second side 12 have different curvature degrees. Since the protruding portions with different curvature degrees are capable of withstanding different bending forces, only part of the protruding portions break even if a wiring structure is subject to a relatively great force while being bent. Similarly, since the curvature degree of the protruding portion on the first side 11 is different from that of the protruding portion on the second side 12 in a same conductive element 10, the protruding portion on only one side breaks even if a wiring structure is subject to a relatively great force while being bent, in which case the wiring structure is still capable of transmitting signals normally, with its use not affected.

Each conductive element 10 is provided with a hollow pattern 13, which may release stress as much as possible when the wiring structure is bent, stretched or twisted, so as to avoid fracture of the wiring structure, while ensuring high conductivity of the wiring structure. The hollow pattern 13 may have a shape of an one of circles, ellipses (as shown in FIG. 2), rectangles and rhombuses, but not limited to the above shapes.

With specific implementations, the wiring structure according to the embodiments will be described below.

Figure 2:
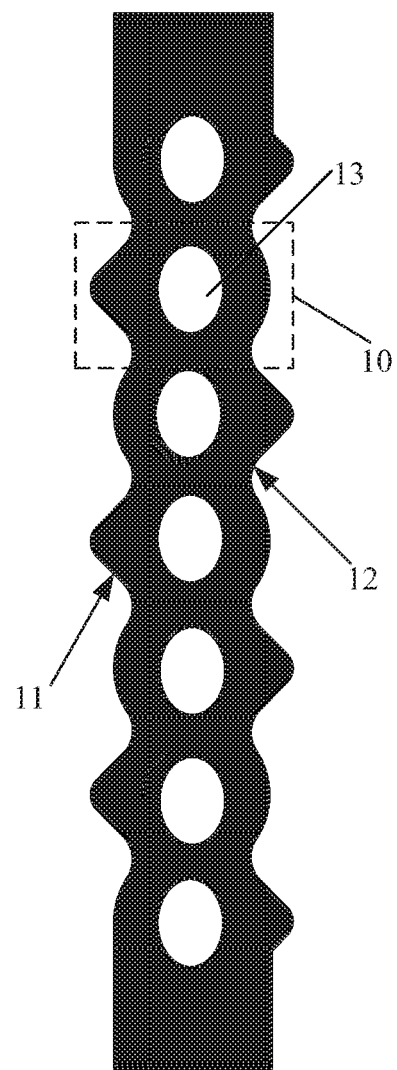
Figure 3:
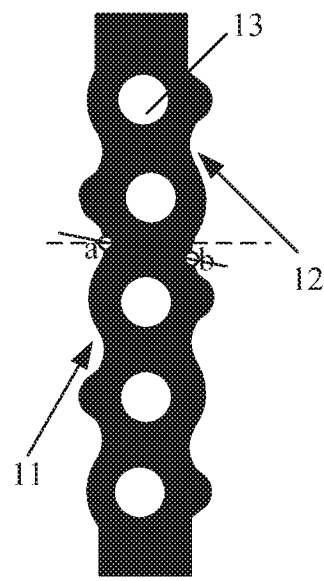

According to the embodiments of the present disclosure, as shown in FIGS. 1-3, the body portion of the wiring structure includes the conductive elements 10 sequentially connected along the extending direction of the wiring structure, wherein each conductive element 10 is provided with one protruding portion on the first side 11 and one protruding portion on the second side 12. As shown in FIG. 3, a connection line connecting a connection point on the first side 11 and a connection point on the second side 12 of two adjacent conductive elements 10 in the body portion extends along a direction which intersects with a direction perpendicular to the extending direction of the wiring structure, that is, in one conductive element 10, a length of the protruding portion on the first side 11 in the extending direction of the wiring structure may be smaller than that of the protruding portion on the second side 12 in the extending direction of the wiring structure. The connection point on the first side 11 (e.g., point a in FIG. 3) and the connection point on the second side 12 (e.g., point b in FIG. 3) of the two adjacent conductive elements 10 in the body portion are stress concentration points when the wiring structure is twisted, bent or stretched. Therefore, the connection line connecting the stress concentration point (i.e., the point a) on the first side 11 and the stress concentration point (i.e., the point b) on the second side 12 of the two adjacent conductive elements 10 in the embodiment is not coincident with a horizontal line (which indicates a straight line extending in a direction perpendicular to the extending direction of the wiring structure). With such structure, when the wiring structure is bent, the connection line connecting the stress concentration points (i.e., the connection line connecting the points a and b) will not be parallel to a bending line (the dashed line in FIG. 3), so as to prevent a crack formed by the bending from extending along the direction of the connection line connecting the strain concentration points, thereby avoiding fracture of the wiring structure, which improves bending resistance and reliability of the wiring structure. Especially for flexible substrates which are likely to be bent due to their own properties, yield of the flexible substrates may be greatly increased by adopting the wiring structure of the embodiment.

According to the embodiments of the present disclosure, in each conductive element 10, the curvature degree of the protruding portion on the first side 11 is different from that of the protruding portion on the second side 12. The protruding portions of any two adjacent conductive elements 10 on the first side 11 have different curvature degrees, and the protruding portions of any two adjacent conductive elements 10 on the second side 12 have different curvature degrees. Each conductive element 10 is provided with one hollow pattern 13. Optionally, all of the conductive element 10 are formed as an integral structure, which may facilitate manufacturing thereof and greatly increase production efficiency.

For obtaining a wiring structure with an even structure, each of the first side 11 and the second side 12 of the body portion may be provided with two kinds of protruding portions having different curvature degrees. The protruding portions having different curvature degrees are alternately arranged on each side. Furthermore, the first side 11 and the second side 12 are provided with the same kinds of protruding portions ("same kinds" here indicate that, under the condition that the protruding portions on the first side 11 and the second side 12 are of an arc shape, for example, radii of curvature of the protruding portions on the first side 11 are 30 mm and 50 mm, while radii of curvature of the protruding portions on the second side 12 are also 30 mm and 50 mm). In such case, the two adjacent conductive elements 10 are centrally symmetrical to each other.

Figure 4:
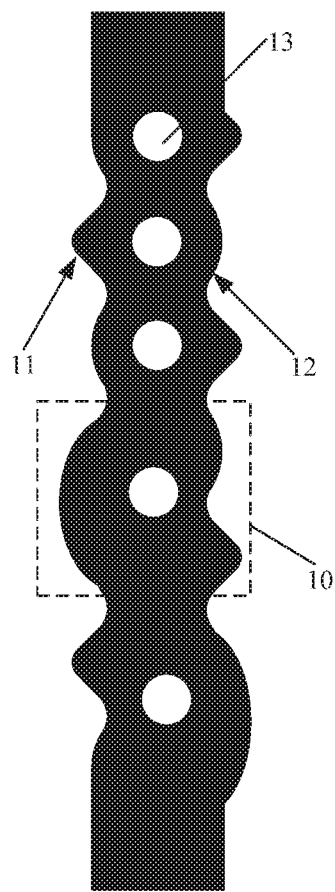
FIG. 4 is a schematic diagram of a wiring structure according to another embodiment of the present disclosure.

According to another embodiment of the present disclosure, as shown in FIG. 4, the body portion of the wiring structure includes the conductive elements 10 sequentially connected along the extending direction of the wiring structure, each of the first side 11 and the second side 12 of the body portion is provided with three kinds of protruding portions having different curvature degrees, the protruding portions of any two adjacent conductive elements 10 on the first side 11 have different curvature degrees, and the protruding portions of any two adjacent conductive elements 10 on the second side 12 have different curvature degrees. Each conductive element 10 is provided with one hollow pattern 13. Optionally, all of the conductive elements 10 are formed as an integral structure, which may facilitate manufacturing thereof and greatly increase production efficiency.

Specifically, as shown in FIG. 4, the configuration of some conductive elements 10 in the body portion of the wiring structure are the same as that in the aforesaid embodiments, one of two adjacent conductive elements 10 among remaining conductive elements 10 includes one protruding portion on the first side 11 and two protruding portions on the second side 12, and the other of the two adjacent conductive elements 10 includes two protruding portions on the first side 11 and one protruding portion on the second side 12. Optionally, the conductive element 10 including one protruding portion on the first side 11 and two protruding portions on the second side 12 and a conductive element 10 adjacent to the conductive element 10 and including two protruding portions on the first side 11 and one protruding portion on the second side 12 are centrally symmetrical to each other.

It should be noted that each of the first side 11 and the second side 12 of the body portion may be provided with more protruding portions having different curvature degrees. Each conductive element 10 may not be limited to the above structures, and may include a plurality of protruding portions on the first side 11 and a plurality of protruding portions on the second side 12, which will not be listed one by one herein.

Figure 5:
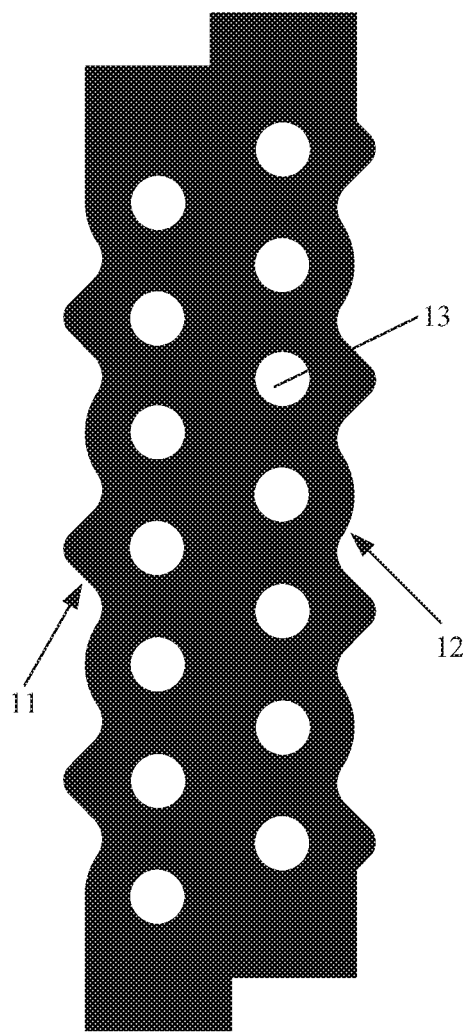
FIG. 5 is a schematic diagram of a wiring structure according to yet another embodiment of the present disclosure.

According to another embodiment of the present disclosure, a wiring structure may be formed by joining together a plurality of wiring structures of any one of the aforesaid kinds. As shown in FIG. 5, the wiring structure includes two body portions; wherein, a first side 11 of one of the two body portions and a second side 12 of the other of the two body portions are joined together to form an integral structure. Optionally, as shown in FIG. 5, the hollow patterns 13 in the two body portions of the wiring structure are arranged in a stagger way, so that none of the hollow patterns in one body portion is aligned with a hollow pattern in the other body portion in a horizontal direction (i.e., a direction perpendicular to an extending direction of the wiring structure). Such arrangement prevents a connection line connecting the hollow patterns 13 in the two body portions from being parallel to the bending line of the wiring structure, so as to avoid that the wiring structure is likely to break while being bent.

As shown in FIGS. 1-5, for each conductive element 10 in the body portion of each aforesaid wiring structure, the length of the protruding portion on the first side 11 in the extending direction of the wiring structure is different from that of the protruding portion on the second side 12 in the extending direction of the wiring structure, and the connection line connecting the strain concentration point on the first side 11 and the strain concentration point on the second side 12 of two adjacent conductive elements 10 is not parallel to the bending line, so as to prevent a crack formed by the bending from extending along a direction of the connection line connecting the strain concentration points, thereby avoiding fracture of the wiring structure, which improves bending resistance and reliability of the wiring structure.

Moreover, in each conductive element 10, the curvature degree of the protruding portion on the first side 11 is different from that of the protruding portion on the second side 12, so that the bending force capable of being withstood by the protruding portion on the first side 11 is different from that capable of being withstood by the protruding portion on the second side 12. Therefore, even if the protruding portion on one side of the conductive element 10 breaks, connection of the wiring structure may still be maintained by the protruding portion on the other side, so as to avoid failure of the wiring structure due to fracture caused by bend.

The embodiment further provides a display substrate, including a base and a wiring structure provided thereon, the wiring structure being any one of the wiring structures according to the aforesaid embodiments.

The display substrate in the embodiment may be a flexible substrate, that is, the base thereof is made of a flexible material, such as polyimide (PI).

In the embodiment, in a body portion of the wiring structure of the display substrate, both a first side 11 and a second side 12 are wavy (i.e., each side is composed of a plurality of connected protruding portions), and in one conductive element 10, a length of a protruding portion on the first side 11 in an extending direction of the wiring structure is smaller than that of a protruding portion on the second side 12 in the extending direction of the wiring structure. With such structure, when the wiring structure is bent, a connection line connecting stress concentration points will not be parallel to a bending line, so as to prevent a crack formed by the bending from extending along a direction of the connection line connecting the strain concentration points, thereby avoiding fracture of the wiring structure, which improves bending resistance and reliability of the wiring structure. Especially for flexible substrates which are likely to be bent due to their own properties, yield of the flexible substrates may be greatly increased by adopting the wiring structure of the embodiment.

Furthermore, for each conductive element 10 in the body portion, a curvature degree of the protruding portion on the first side 11 is different from that of the protruding portion on the second side 12, so that a bending force capable of being withstood by the protruding portion on the first side 11 is different from that capable of being withstood by the protruding portion on the second side 12. Therefore, even if the protruding portion having a smaller curvature degree in the conductive element 10 breaks, connection of the wiring structure may still be maintained by the other protruding portion having a greater curvature degree, so as to avoid failure of the wiring structure due to fracture caused by bend. Especially for flexible substrates which are likely to be bent due to their own properties, yield of the flexible substrates may be greatly increased by adopting the wiring structure of the embodiment.

The embodiment further provides a display device, including the display substrate of the aforesaid embodiment, thereby having better performance.

The display device may be any product or component having a display function, such as a liquid crystal panel, electronic paper, an OLED panel, a mobile phone, a tablet computer, a TV, a display, a laptop, a digital photo frame and a navigator.

It should be understood that the foregoing implementations are merely exemplary implementations adopted for describing the principle of the present disclosure, but the present disclosure is not limited thereto. Those of ordinary skill in the art may make various variations and improvements without departing from the spirit and essence of the present disclosure, and these variations and improvements shall be considered to fall into the protection scope of the present disclosure.

What is claimed is:

1. A wiring structure, comprising a plurality of body portions provided with hollow patterns, wherein
each body potion of the plurality of the body portions has a first side and a second side which are provided opposite to each other along an extending direction of the wiring structure, and both the first and second sides are wavy; and
each body potion of the plurality of the body portions comprises a plurality of conductive elements sequentially connected along the extending direction of the wiring structure; and at least one conductive element of the plurality of conductive elements each comprises at least one protruding portion on the first side and at least one protruding portion on the second side;
wherein each body potion of the plurality of the body portions is self-continuous along the extending direction of the wiring structure, and a first side of one of every two adjacent body portions and a second side of the other of the two adjacent body portions are joined together to form an integral structure, and
the hollow patterns in the two adjacent body portions are staggered so that none of the hollow patterns in one of the two adjacent body portions is aligned with a hollow pattern in the other of the two adjacent body portions in a direction perpendicular to the extending direction of the wiring structure.

2. The wiring structure of claim 1, wherein in each of the at least one conductive element, a curvature degree of the protruding portion on the first side is different from that of the protruding portion on the second side.

3. The wiring structure of claim 1, wherein any two adjacent protruding portions on the first side have different curvature degrees.

4. The wiring structure of claim 1, wherein any two adjacent protruding portions on the second side have different curvature degrees.

5. The wiring structure of claim 1, wherein any two adjacent protruding portions on the first side have different curvature degrees, and any two adjacent protruding portions on the second side have different curvature degrees.

6. The wiring structure of claim 3, wherein each of the at least one conductive element comprises one protruding portion on the first side and one protruding portion on the second side.

7. The wiring structure of claim 6, wherein every two adjacent conductive elements are centrally symmetrical to each other in structure.

8. The wiring structure of claim 3, wherein each of the first and second sides is provided with at least three protruding portions having different curvature degrees.

9. The wiring structure of claim 8, wherein from at least one pair of two adjacent conductive elements in the body portion, one of the two adjacent conductive elements comprises one protruding portion on the first side and two protruding portions on the second side, and the other of the two adjacent conductive elements comprises two protruding portions on the first side and one protruding portion on the second side.

10. The wiring structure of claim 9, wherein the conductive element comprising one protruding portion on the first side and two protruding portions on the second side and the other conductive element adjacent to the conductive element and comprising two protruding portions on the first side and one protruding portion on the second side are centrally symmetrical to each other in structure.

11. The wiring structure of claim 1, wherein each of the plurality of conductive elements is provided with one hollow pattern.

12. The wiring structure of claim 1, wherein the hollow pattern has a shape of one of circles, ellipses, rectangles, and rhombuses.

13. The wiring structure of claim 1, wherein the plurality of conductive elements are formed to be an integral structure.

14. A display substrate, comprising a base and a wiring structure provided on the base, wherein the wiring structure is the wiring structure of claim 1.

15. A display device, comprising a display substrate, wherein the display substrate is the display substrate of claim 14.

16. The wiring structure of claim 4, wherein each of the at least one conductive element comprises one protruding portion on the first side and one protruding portion on the second side.

17. The wiring structure of claim 5, wherein each of the at least one conductive element comprises one protruding portion on the first side and one protruding portion on the second side.

18. The wiring structure of claim 4, wherein each of the first and second sides is provided with at least three protruding portions having different curvature degrees.

* * * * *